(12) United States Patent
Jung et al.

(10) Patent No.: US 11,284,529 B2
(45) Date of Patent: Mar. 22, 2022

(54) ELECTRONIC COMPONENT HOUSING AND DC-DC CONVERTER COMPRISING SAME

(71) Applicant: LG INNOTEK CO., LTD., Seoul (KR)

(72) Inventors: Jae Hoo Jung, Seoul (KR); Woo Sang Chung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/467,453

(22) PCT Filed: Dec. 6, 2017

(86) PCT No.: PCT/KR2017/014204
§ 371 (c)(1),
(2) Date: Jun. 6, 2019

(87) PCT Pub. No.: WO2018/110890
PCT Pub. Date: Jun. 21, 2018

(65) Prior Publication Data
US 2020/0077530 A1 Mar. 5, 2020

(30) Foreign Application Priority Data

Dec. 14, 2016 (KR) .................. 10-2016-0170576
Dec. 26, 2016 (KR) .................. 10-2016-0179533

(51) Int. Cl.
*H05K 5/06* (2006.01)
*H02M 3/00* (2006.01)
(Continued)

(52) U.S. Cl.
CPC .............. *H05K 5/061* (2013.01); *H02M 3/00* (2013.01); *H02M 7/00* (2013.01); *H05K 5/0082* (2013.01);
(Continued)

(58) Field of Classification Search
CPC ...... H05K 5/06; H05K 5/0082; H05K 7/1432; H05K 7/20; H05K 5/061; H02M 3/00; H02M 7/00
See application file for complete search history.

(56) References Cited

U.S. PATENT DOCUMENTS 6,407,925 B1 * 6/2002 Kobayashi ........... H05K 5/0052
200/61.88
8,014,158 B2 * 9/2011 Kojima ................. H05K 5/062
361/752
(Continued)

FOREIGN PATENT DOCUMENTS

CN 201936927 U 8/2011
CN 102733927 A 10/2012
(Continued)

*Primary Examiner* — Rockshana D Chowdhury
*Assistant Examiner* — Douglas R Burtner
(74) *Attorney, Agent, or Firm* — Birch, Stewart, Kolasch & Birch, LLP

(57) ABSTRACT

The present invention provides an electronic component housing comprising: a first housing; a second housing; a sealing member positioned between the first housing and the second housing; and a fixing member for fixing the first housing to the second housing, wherein the sealing member penetrates the first housing so as to be insert-injected therein.

19 Claims, 12 Drawing Sheets

(51) Int. Cl.
 *H02M 7/00* (2006.01)
 *H05K 5/00* (2006.01)
 *H05K 7/14* (2006.01)
 *H05K 7/20* (2006.01)

(52) U.S. Cl.
 CPC ............ *H05K 5/06* (2013.01); *H05K 7/1432* (2013.01); *H05K 7/20* (2013.01)

(56) References Cited

U.S. PATENT DOCUMENTS

| | | | | |
|---|---|---|---|---|
| RE47,964 E | * | 4/2020 | Lee | ........................ G02B 6/0023 |
| 10,985,416 B2 | * | 4/2021 | Sakaguchi | ........ H01M 10/6555 |
| 2002/0154486 A1 | * | 10/2002 | Koike | .................. H05K 5/0073 |
| | | | | 361/704 |
| 2007/0218721 A1 | * | 9/2007 | Naritomi | ................ H05K 5/062 |
| | | | | 439/131 |
| 2011/0044005 A1 | | 2/2011 | Wetzel et al. | |
| 2011/0259890 A1 | * | 10/2011 | Hsu | ........................ H05K 5/061 |
| | | | | 220/324 |
| 2012/0320544 A1 | * | 12/2012 | Ohhashi | ................. H05K 5/062 |
| | | | | 361/752 |
| 2013/0273985 A1 | * | 10/2013 | Kageyama | ............. H05K 5/061 |
| | | | | 455/575.8 |
| 2014/0374133 A1 | * | 12/2014 | Rost | ....................... H05K 5/061 |
| | | | | 174/50.51 |
| 2015/0151643 A1 | | 6/2015 | Moon | |
| 2015/0377355 A1 | * | 12/2015 | Coenegracht | ........ H05K 5/0095 |
| | | | | 312/223.4 |
| 2016/0039276 A1 | | 2/2016 | Takahashi et al. | |
| 2016/0165736 A1 | * | 6/2016 | Tsuboi | ................... H02K 11/33 |
| | | | | 310/71 |
| 2017/0113854 A1 | * | 4/2017 | Lee | ........................ B65D 53/06 |
| 2018/0023705 A1 | * | 1/2018 | Watanabe | ................ F16J 15/08 |
| | | | | 277/647 |
| 2018/0254620 A1 | * | 9/2018 | Kosuga | ................ H01R 13/5202 |
| 2019/0252971 A1 | * | 8/2019 | Kim | ........................ H05K 7/14 |

FOREIGN PATENT DOCUMENTS

| | | |
|---|---|---|
| CN | 105792582 A | 7/2016 |
| JP | 2007-335518 A | 12/2007 |
| KR | 10-2010-0103607 A | 9/2010 |
| KR | 10-2015-0065092 A | 6/2015 |
| KR | 10-2015-0082042 A | 7/2015 |
| KR | 10-2015-0136515 A | 12/2015 |

* cited by examiner

1

1100

ELECTRONIC COMPONENT HOUSING AND DC-DC CONVERTER COMPRISING SAME

CROSS REFERENCE TO RELATED APPLICATIONS

This application is the National Phase of PCT International Application No. PCT/KR2017/014204, filed on Dec. 6, 2017, which claims priority under 35 U.S.C. 119(a) to Patent Application Nos. 10-2016-0170576, filed in the Republic of Korea on Dec. 14, 2016 and 10-2016-0179533, filed in the Republic of Korea on Dec. 26, 2016, all of which are hereby expressly incorporated by reference into the present application.

TECHNICAL FIELD

Exemplary embodiments relate to an electronic component housing and a direct current (DC)-DC converter including the same.

BACKGROUND ART

A hybrid vehicle using a motor includes a motor control unit for controlling the motor, and a direct current (DC)-DC converter.

The DC-DC converter is a device for converting a DC voltage. The DC-DC converter may obtain a DC voltage by converting a DC voltage into an alternating-current (AC) voltage, transforming the AC voltage, and then rectifying the transformed AC voltage again.

The DC-DC converter is configured by assembling a circuit board with a power module. The DC-DC converter has a structure for protecting and sealing the circuit board and the power module with a housing for the purpose of waterproofing and dust proofing.

In an electronic component housing used for the DC-DC converter, the circuit and the power module are disposed in an inner space formed by a coupling of an upper housing and a lower housing, and a sealing structure is formed using a gasket.

However, when the sealing structure is provided using the gasket, there is a problem in that functions of waterproofing and dust proofing vary according to an assembled state of the gasket. When the gasket is assembled by being positioned between the upper housing and the lower housing, there is a problem in that sealing is not achieved when the gasket is inclined.

Further, since the gasket and the upper and lower housings are separately assembled and thus a separate additional process is required, loss of time and money occurs.

In addition, when a sealant is applied between the gasket and the upper and lower housings, it is difficult to apply and cure the sealant, and when the gasket and the upper and lower housings are assembled and moved, the sealant is smeared on the hands of an operator such that there is a concern that defects may occur.

Moreover, owing to a durability temperature of the circuit board positioned inside the upper and lower housings, a curing temperature cannot rise such that there is a problem in that a curing time increases.

DISCLOSURE

Technical Problem

Exemplary embodiments are directed to providing an electronic component housing including a gasket integrated with a housing, and a direct current (DC)-DC converter including the same.

Further, the exemplary embodiments are directed to providing an electronic component housing having a structure in which a first housing and a second housing are sealed to be spaced apart from each other, and a DC-DC converter including the same.

The problems to be solved by the present invention are not limited to those described above, and other problems not mentioned above should be clearly understood by those skilled in the art from the following description.

Technical Solution

One aspect of the present invention provides an electronic component housing including a first housing, a second housing, a sealing member disposed between the first housing and the second housing, and a fixing member configured to fix the first housing to the second housing, wherein the sealing member passes through the first housing to be insert-injected thereto.

The sealing member may be disposed to be spaced inward from outermost periphery of the first housing.

The sealing member may include an upper sealing member disposed above the first housing, a lower sealing member disposed below the first housing, and a plurality of connectors configured to connect the upper sealing member to the lower sealing member, wherein a connection hole through which the connector passes may be formed in the first housing.

An accommodating groove configured to accommodate the lower sealing member may be formed in the second housing.

A length of the lower sealing member may be provided to be longer than a depth of the accommodating groove.

The first housing may include a through hole through which the fixing member passes.

The second housing may include a coupling groove to which the fixing member is coupled.

A plurality of through holes may be provided, and the connector may be disposed between the plurality of through holes.

An inclined portion may be provided at an entrance of the accommodating groove.

A width of the accommodating groove may be formed to be wider than that of the lower sealing member.

The width of the connector may be formed to not exceed a wider width of either the upper sealing member or the lower sealing member.

The second housing may further include an electronic component accommodating part configured to accommodate the electronic component, and a flow path through which a fluid can flow.

Another aspect of the present invention provides a direct current (DC)-DC converter including a first housing, a second housing coupled to the first housing and including an electronic component accommodating part configured to accommodate an electronic component, the electronic component disposed in the electronic component accommodating part, a sealing member disposed between the first housing and the second housing, and a fixing member configured to fix the first housing to the second housing, wherein the sealing member is insert-injected to the first housing and includes an upper sealing member, a lower sealing member, and a connector configured to connect the upper sealing member to the lower sealing member.

An accommodating groove configured to accommodate the lower sealing member may be formed in the second housing.

Still another aspect of the present invention provides an electronic component housing including a first housing, a second housing, a sealing member disposed between the first housing and the second housing, and a fixing member configured to fix the first housing to the second housing, wherein the first housing is separated from the second housing by the sealing member, and the first housing includes a first guide portion for preventing movement of the sealing member.

The second housing may include a second guide portion disposed at a position corresponding to the first guide portion.

Each of the first guide portion and the second guide portion may be formed of a groove.

The first guide portion and the second guide portion may be disposed to be spaced inward from outermost peripheries of the first housing and the second housing.

The first housing may include at least one support.

A plurality of supports may be provided and disposed to intersect with each other.

The supports may each be formed such that the first housing is recessed inward.

The supports may each be formed such that the first housing protrudes outward.

The supports may be disposed in a bilaterally symmetrical structure.

The first housing may include a through hole through which the fixing member passes.

The second housing may include a coupling groove to which the fixing member is coupled.

The through hole may be disposed on an outer side of the first guide portion.

The second housing may include an electronic component accommodating part configured to accommodate the electronic component, and a flow path through which a fluid can flow.

A shortest separation distance between the first housing and the second housing may be set in a range of 0.5 to 1.5 mm.

The first housing may be formed using aluminum pressing.

The sealing member may be formed to have a width that is wider than a width of each of the first guide portion and the second guide portion.

Yet another aspect of the present invention provides a direct current (DC)-DC converter including a first housing, a second housing coupled to the first housing and including an electronic component accommodating part configured to accommodate an electronic component, the electronic component disposed in the electronic component accommodating part, a sealing member disposed between the first housing and the second housing, and a fixing member configured to fix the first housing to the second housing, wherein the first housing is separated from the second housing by the sealing member, and the first housing includes a first guide portion for preventing movement of the sealing member.

The second housing may include a second guide portion disposed at a position corresponding to the first guide portion.

The first housing may include at least one support.

The sealing member may be formed to have a width that is wider than a width of each of the first guide portion and the second guide portion.

Advantageous Effects

In accordance with the present invention, there is an effect that defects occurring during a gasket assembly process can be minimized.

Further, since the gasket assembly process is omitted, there is an effect that time and costs are reduced.

Further, there is an effect that defective products due to defective application are reduced.

Further, there is an effect in that, when internal parts need to be replaced, reworking is possible and it is possible to reduce a cost of a housing which is discarded since reworking is not possible with the conventional method.

Further, sealant applying and curing processes are simultaneously performed on a housing such that there is an effect of reducing a curing time of a sealant.

Further, analysis and improvement of defective products performed after completely assembling a product is facilitated such that time and costs for reworking can be reduced.

MODES OF THE INVENTION

Figure 1:
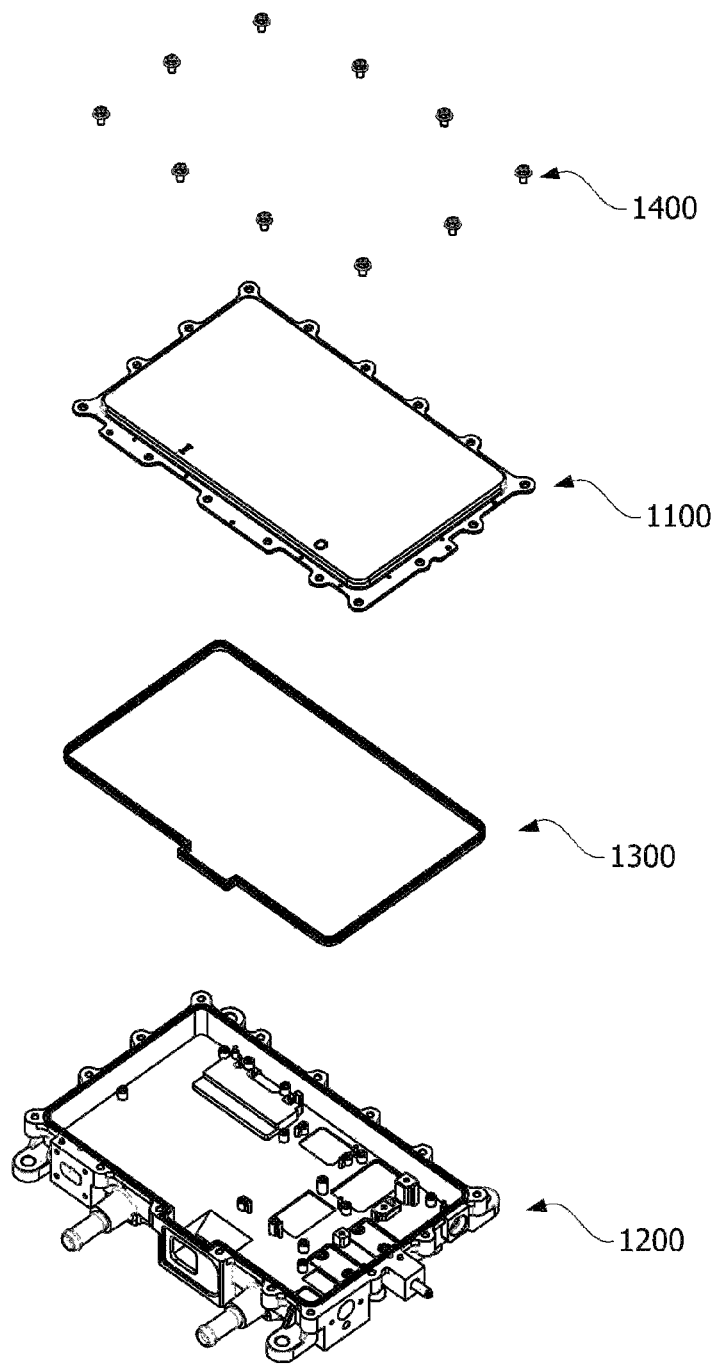
FIG. 1 is an exploded perspective view of an electronic component housing according to a first embodiment of the present invention.

The present invention may be modified in various forms and may have a variety of embodiments, and, therefore, specific embodiments will be illustrated in the drawings and a description thereof will be described. The embodiments, however, are not to be taken in a sense for limiting the present invention to the specific embodiments, and should be construed to include modifications, equivalents, or substitutions within the spirit and technical scope of the present invention.

Also, the terms including ordinal numbers such as "first," "second," and the like used herein can be used to describe various components, but the components are not limited by these terms. The terms are used only for the purpose of distinguishing one component from another component. For example, without departing from the scope of the present invention, a first component may be referred to as a second component, and similarly, the second component may also be referred to as the first component. The term "and/or" includes a combination of a plurality of related listed items or any one item of the plurality of related listed items.

The terms used herein are employed to describe only specific embodiments and are not intended to limit the present invention. Unless the context clearly dictates otherwise, the singular form includes the plural form. It should be understood that the terms of "comprise" and "have" specify the presence of stated herein features, numbers, steps, operations, elements, components, or a combination thereof, but do not preclude the presence or probability of addition of one or more another features, numbers, steps, operations, elements, components, or a combination thereof.

In the description of the embodiments, when an element is described as being formed "on" or "under" another element, the terms "on" or "under" includes the meaning of the two components bring in direct contact with each other (directly) and the meaning of one or more other components being disposed and formed between the two components (indirectly). Also, when described as being "on or under," the term "on or under" may mean not only an upward direction but also a downward direction based on one element.

Hereinafter, exemplary embodiments of the present invention will be described in detail with reference to the accompanying drawings, the same reference numerals will be assigned to the same or corresponding components regardless of reference numerals, and duplicate descriptions thereof will be omitted.

FIGS. 1 to 7 illustrate clearly main feature parts only so as to provide a conceptual and clear understanding of the present invention. As a result, various modifications of the illustrations are to be expected, and the scope of the present invention is not necessarily limited by specific shapes shown in the drawings.

Figure 2:
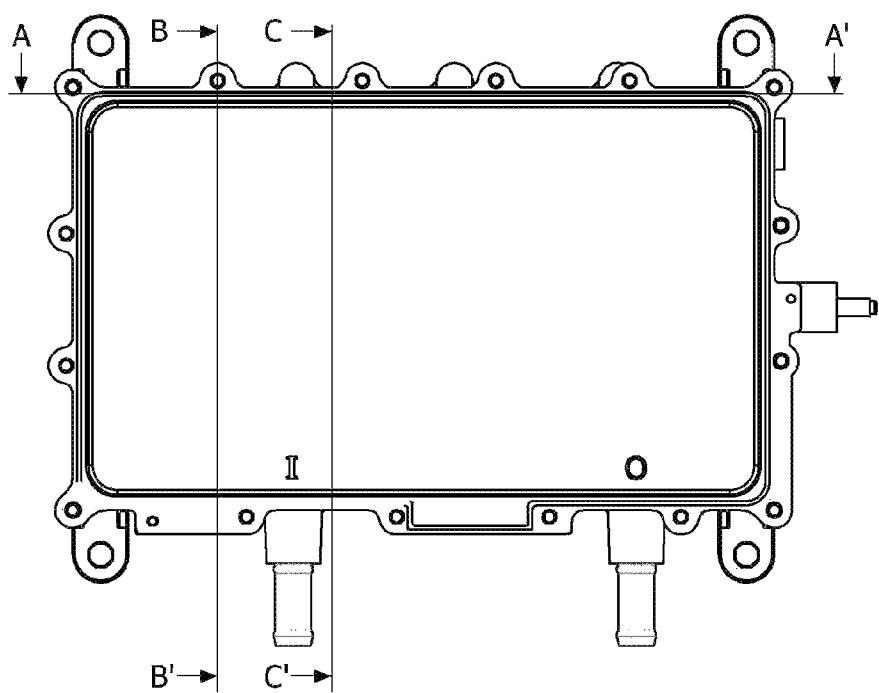
FIG. 2 is a diagram illustrating a coupling state of the electronic component housing of FIG. 1.
Figure 3:
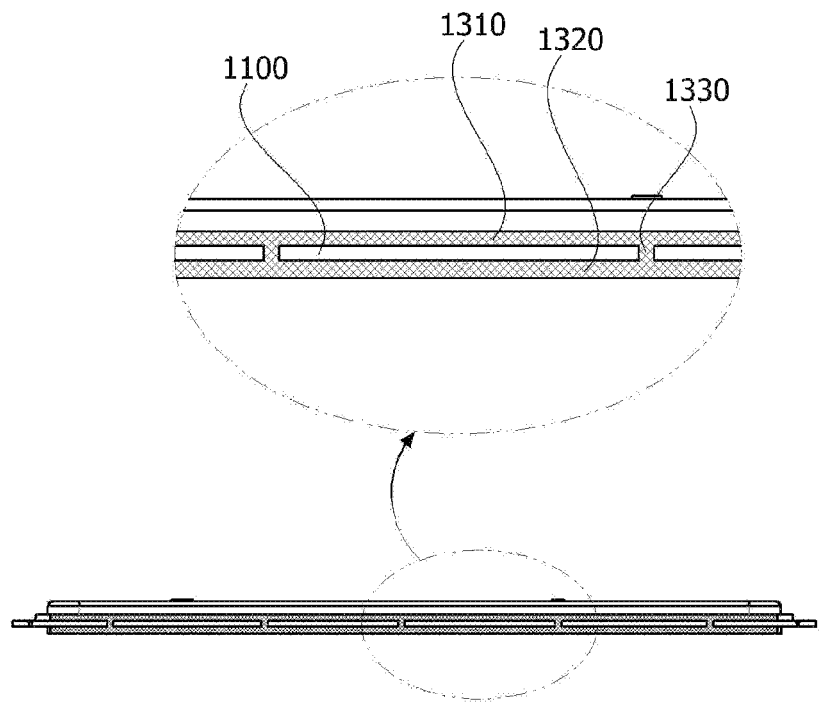
FIG. 3 is a cross-sectional view taken along line A-A' of a first housing shown in FIG. 2.
Figure 4:
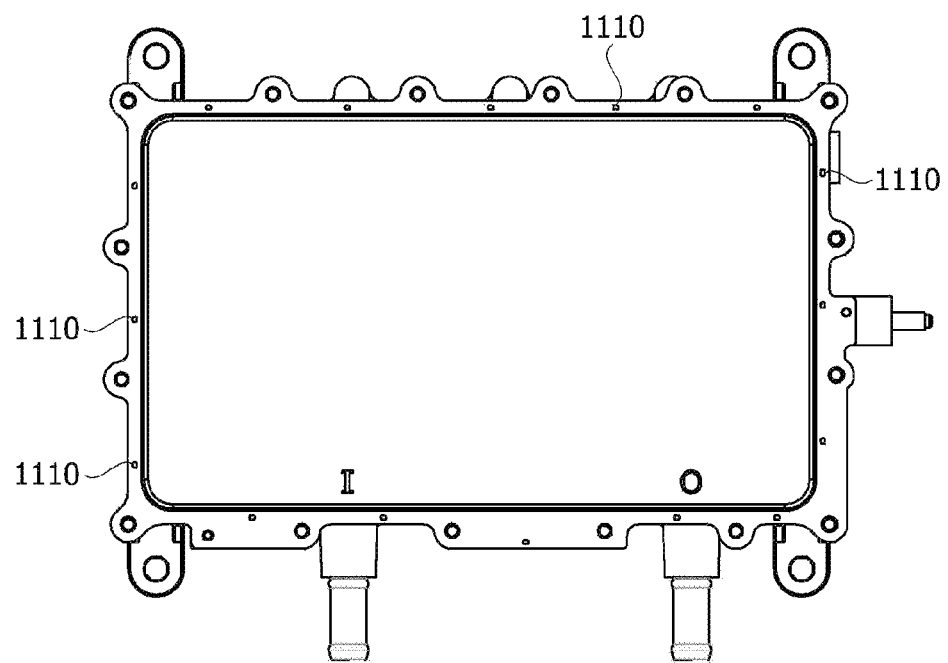
FIG. 4 is a diagram illustrating the first housing which is a component of FIG. 1.
Figure 5:
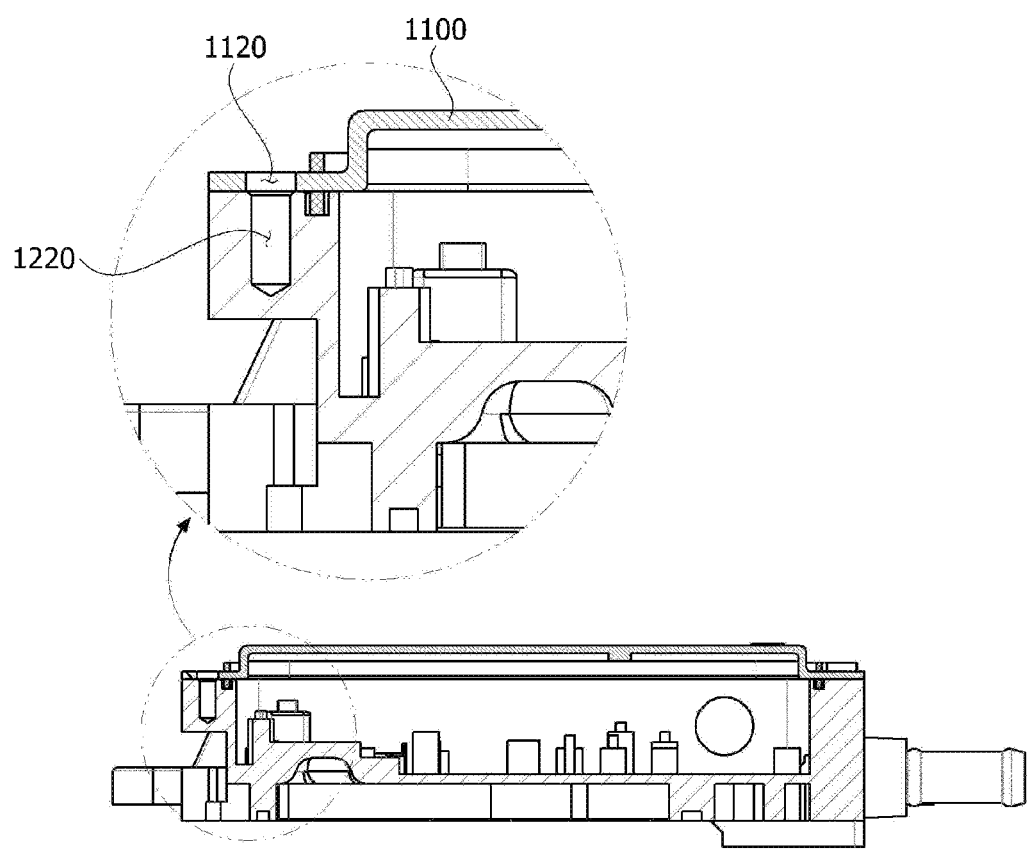
FIG. 5 is a cross-sectional view taken along line B-B' shown in FIG. 1.
Figure 6:
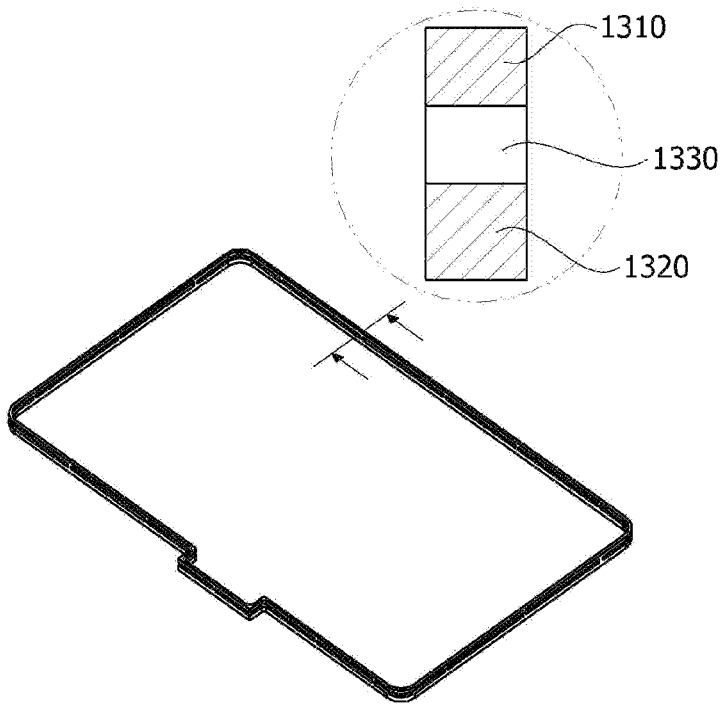
FIG. 6 is a diagram illustrating a structure of a sealing member which is a component of FIG. 1.
Figure 7:
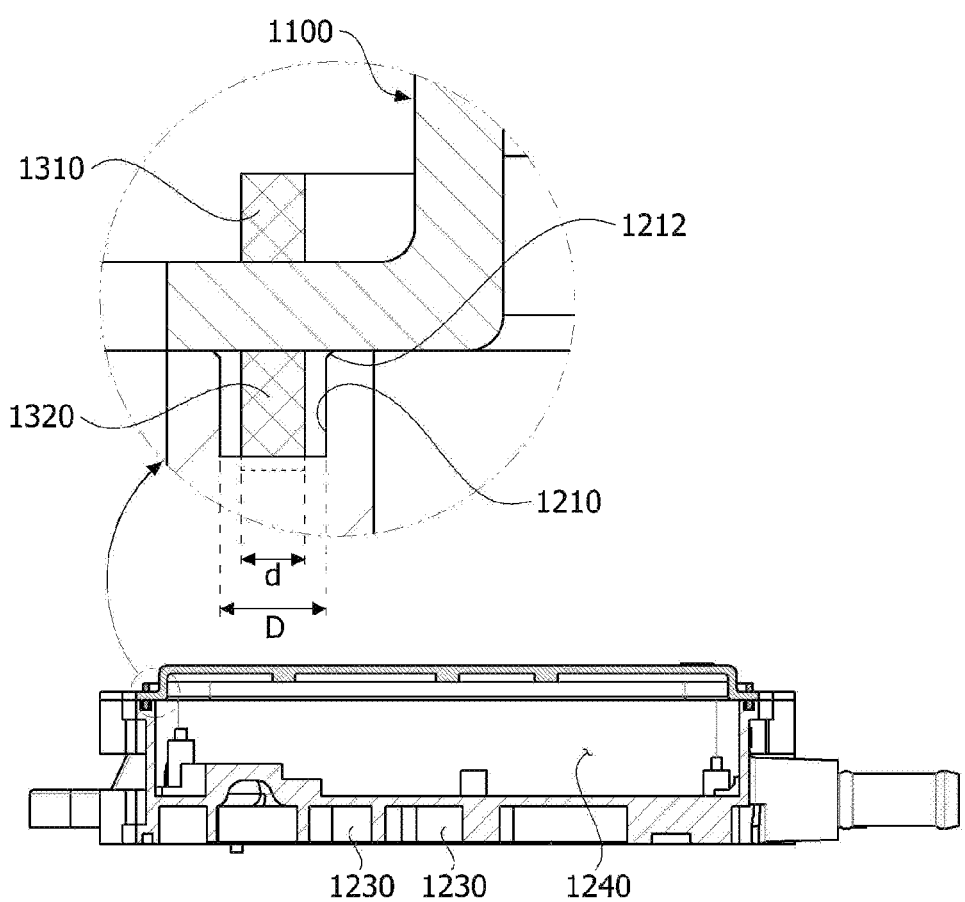
FIG. 7 is a cross-sectional view taken along line C-C' shown in FIG. 2.

FIG. 1 is an exploded perspective view of an electronic component housing according to an exemplary embodiment of the present invention, FIG. 2 is a diagram illustrating a coupling state of the electronic component housing, FIG. 3 is a cross-sectional view taken along line A-A' of a first housing, FIG. 4 is a diagram illustrating the first housing which is a component of the present invention, FIG. 5 is a cross-sectional view taken along line B-B' of the electronic component housing, FIG. 6 is a diagram illustrating a structure of a sealing member which is a component of the present invention, and FIG. 7 is a cross-sectional view taken along line C-C' shown in FIG. 2.

Referring to FIGS. 1 to 7, an electronic component housing 1 according to an exemplary embodiment of the present invention includes a first housing 1100, a second housing 1200, a sealing member 1300, and fixing members 1400.

The first housing 1100 may be disposed above and coupled to the second housing 1200 to form an inner space in which an electronic component is disposed. When the first housing 1100 is coupled to the second housing 1200, the first housing 1100 may serve as a cover and include a plurality of through holes 1120 in which the fixing members 1400 are fixed.

An electronic component accommodating part 1240 for accommodating an electronic component 1500 may be formed in the second housing 1200. A flow path 1230 through which a fluid can flow to release heat generated from the electronic component 1500 may be provided in a lower portion of the second housing 1200.

The flow path 1230 may allow cooling water supplied through a cooling part (not shown) to circulate, thereby releasing heat generated from the electronic component 1500. A shape of the flow path is not limited and may be modified into various shapes.

A coupling groove 1220 to which the fixing member 1400 is coupled may be formed in the second housing 1200. The coupling groove 1220 may be disposed to face the through hole 1120 formed in the first housing 1100. The fixing member 1400 may pass through the through hole 1120 to be fixed to the coupling groove 1220. For example, when a screw is used as the fixing member 1400, a screw thread may be formed on an inner surface forming the coupling groove 1220.

The sealing member 1300 may be disposed between the first housing 1100 and the second housing 1200 and may form a sealing structure of the housings through pressing the fixing member 1400. The sealing member 1300 may pass through the first housing 1100 to be insert-injected thereto. A plurality of connection holes 1110 configured to be connected to the sealing member 1300 when the sealing member 1300 is insert-injected may be formed in the first housing 1100.

The sealing member 1300 may be made of an elastic material and, when pressed, the sealing member 1300 may increase a compressive force. For example, the sealing member 1300 may be made of rubber.

The sealing member 1300 may be disposed to be spaced inward from an outermost periphery of the first housing 1100. The first housing 1100 is provided to match in shape with the second housing 1200. Thus, the first housing 1100 may be modified into various shapes. The sealing member 1300 may be disposed to be spaced inward from the outermost periphery of the first housing 1100 according to a shape thereof. For example, the sealing member 1300 may be disposed to be spaced a predetermined interval apart from the outermost periphery of the first housing 1100. This may uniformly distribute a pressing force due to the fixing member 1400.

The sealing member 1300 may include an upper sealing member 1310 having a closed curve structure, a lower sealing member 1320 having a closed curve structure, and a plurality of connectors 1330 for connecting the upper sealing member 1310 to the lower sealing member 1320.

Referring to FIG. 3, the upper sealing member 1310 is brought into contact with an upper surface of the first housing 1100, and the lower sealing member 1320 is brought into contact with a lower surface of the first housing 1100. In this case, the connector 1330 may pass through the connection hole 1110 of the first housing 1100 to connect the upper sealing member 1310 to the lower sealing member 1320.

When the sealing member 1300 is insert-injected to the first housing 1100, the connector 1330 may be formed through the connection hole 1110 formed in the first housing 1100. As shown in FIG. 4, the connection hole 1110 may be disposed between a plurality of through holes 1120 formed in the first housing 1100. For example, the connection hole 1110 may be disposed in one region of a central portion between the through holes 1120. When the housings are pressed using the fixing member 1400, the connector 1330 disposed in the central portion between the through holes 1120 may uniformly distribute a load applied by the fixing member 1400, thereby minimizing distortion or deformation when coupled.

Referring to FIG. 6, a width of the connector 1330 may be formed to not exceed a wider width of either the upper sealing member 1310 or the lower sealing member 1320.

During the insert injection, the width of the connector 1330 is determined according to a size of the connection hole 1110.

When the width of the connector 1330 is wider than that of the upper sealing member 1310 or the lower sealing member 1320, a problem of the insert injection may occur due to an injection pressure. In order to prevent such a problem, the width of the connector 1330 may be limited. For example, the upper sealing member 1310, the lower sealing member 1320, and the connector 1330 may be provided to have the same width. When the sealing member 1300 is insert-injected, since sequentially stacked materials are provided to have the same width, it is possible to prevent problems including pore generation, shape deformation, and the like due to the sequentially stacked materials.

Referring to FIG. 7, an accommodating groove 1210 for accommodating the lower sealing member 1320 may be formed in the second housing 1200. The accommodating groove 1210 may be formed along a shape of the lower sealing member 1320 and may be formed to be wider than the width of the lower sealing member 1320. Further, a depth of the accommodating groove 1210 may be shorter than a length of the lower sealing member 1320.

Since a width D of the accommodating groove 1210 is wider than a width d of the sealing member 1300, when the first housing 1100 is assembled with the second housing 1200, it is possible to prevent a problem in which the lower sealing member 1320 is not properly inserted.

Further, when the lower sealing member 1320, which is provided to have a length that is longer than the depth of the accommodating groove 1210, is inserted into the accommodating groove 1210, the lower sealing member 1320 made of an elastic member may be laterally deformed due to pressing. The accommodating groove 1210 having a width that is wider than that of the lower sealing member 1320 may accommodate deformation of the lower sealing member 1320 and maintain a pressing force applied to the lower sealing member.

An inclined portion 1212 may be formed at an entrance of the accommodating groove 1210. The inclined portion 1212 may guide the lower sealing member 1320 into the accommodating groove 1210 to facilitate an assembly process.

The fixing member 1400 may couple the first housing 1100 to the second housing 1200 to form a sealing structure. The fixing member 1400 may be coupled to the coupling groove 1220 formed in the second housing 1200 by passing through the through hole 1120 formed in the first housing 1100.

For example, a screw may be used as the fixing member 1400. Various kinds of members for coupling the housings may be used as the fixing member 1400.

Hereinafter, a direct current (DC)-DC converter according to another exemplary embodiment of the present invention will be described below with reference to the accompanying drawings. However, descriptions of components which are the same as those of the electronic component housing according to the exemplary embodiment of the present invention will be omitted.

Figure 8:
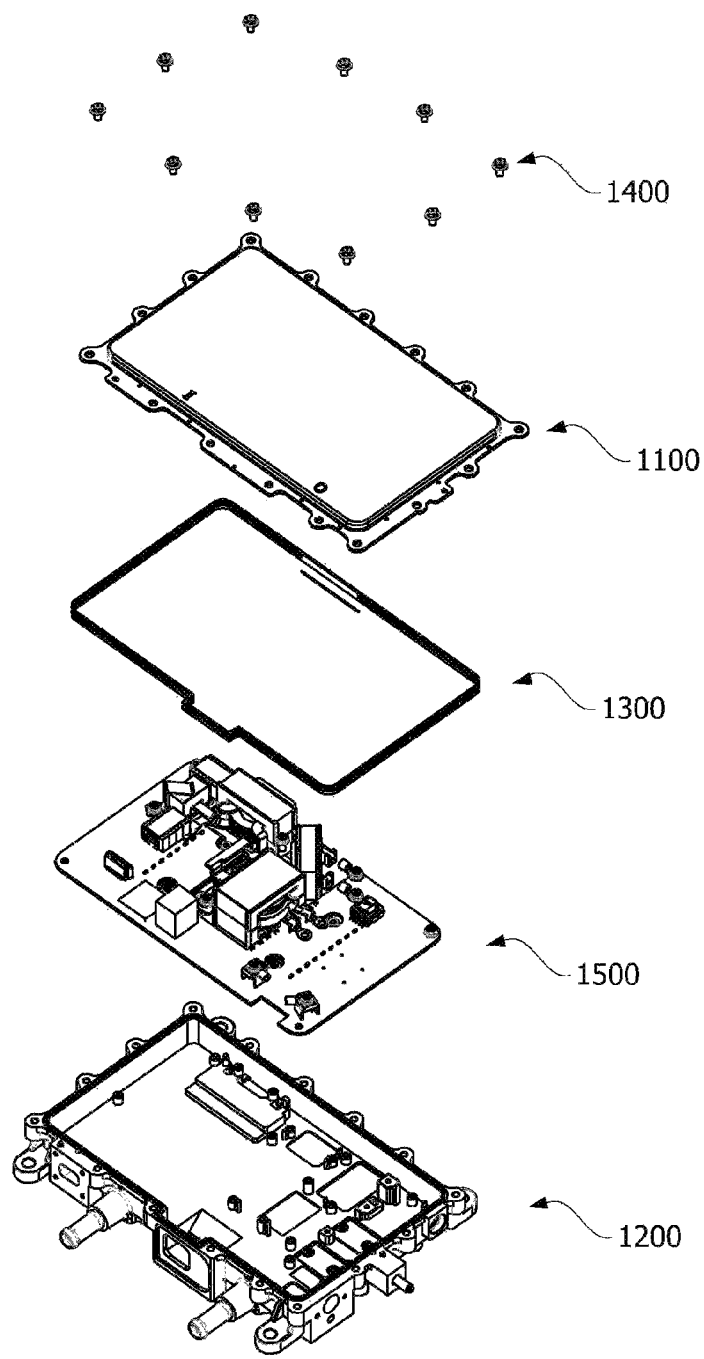
FIG. 8 is a diagram illustrating a structure of a direct current (DC)-DC converter according to another exemplary embodiment of the present invention.

FIG. 8 is a diagram illustrating a structure of the DC-DC converter according to another exemplary embodiment of the present invention. In FIG. 8, the same reference numerals as in FIGS. 1 to 7 denote the same members, and thus detailed descriptions thereof will be omitted.

Referring to the drawing, a DC-DC converter 2 according to another exemplary embodiment of the present invention may include the first housing 1100, the second housing 1200 coupled to the first housing 1100 and including an electronic component accommodating part for accommodating the electronic component 1500, the electronic component 1500 disposed in the electronic component accommodating part, the sealing member 1300 disposed between the first housing 1100 and the second housing 1200, and the fixing member 1400 fixing the first housing 1100 to the second housing 1200. The sealing member 1300 may be insert-injected to the first housing 1100 and may include an upper sealing member 1310, a lower sealing member 1320, and a connector 1330 for connecting the upper sealing member 1310 to the lower sealing member 1320.

The DC-DC converter 2 is a device for converting a DC voltage. The DC-DC converter 2 may obtain a DC voltage by converting a DC voltage into an alternating-current (AC) voltage, transforming the AC voltage, and then rectifying the transformed AC voltage again. The electronic component which is a component of the present invention may include various components for implementing the electronic component.

For example, the electronic component 1500 may include various components such as a switch, a transformer, a rectifier diode, and the like.

Hereinafter, a second embodiment of the present invention will be described.

Figure 9:
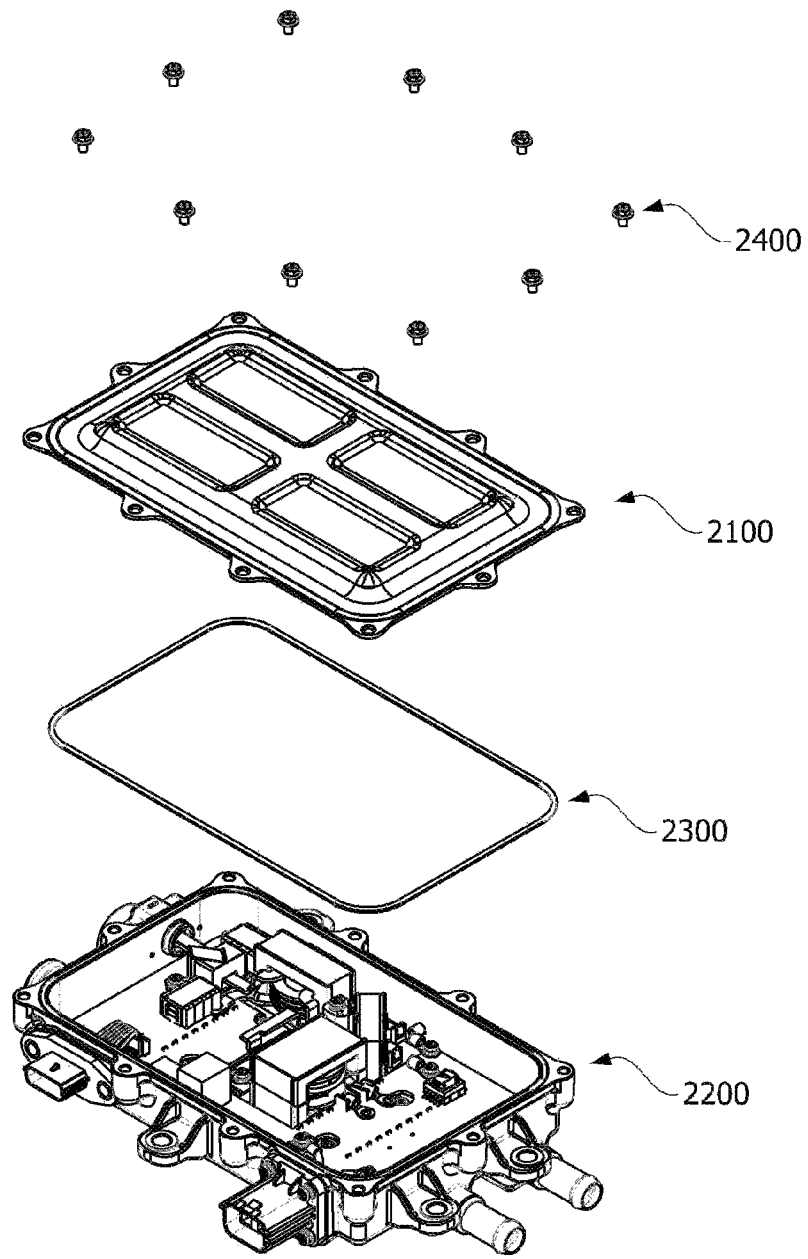
FIG. 9 is an exploded perspective view of an electronic component housing according to a second embodiment of the present invention.
Figure 10:
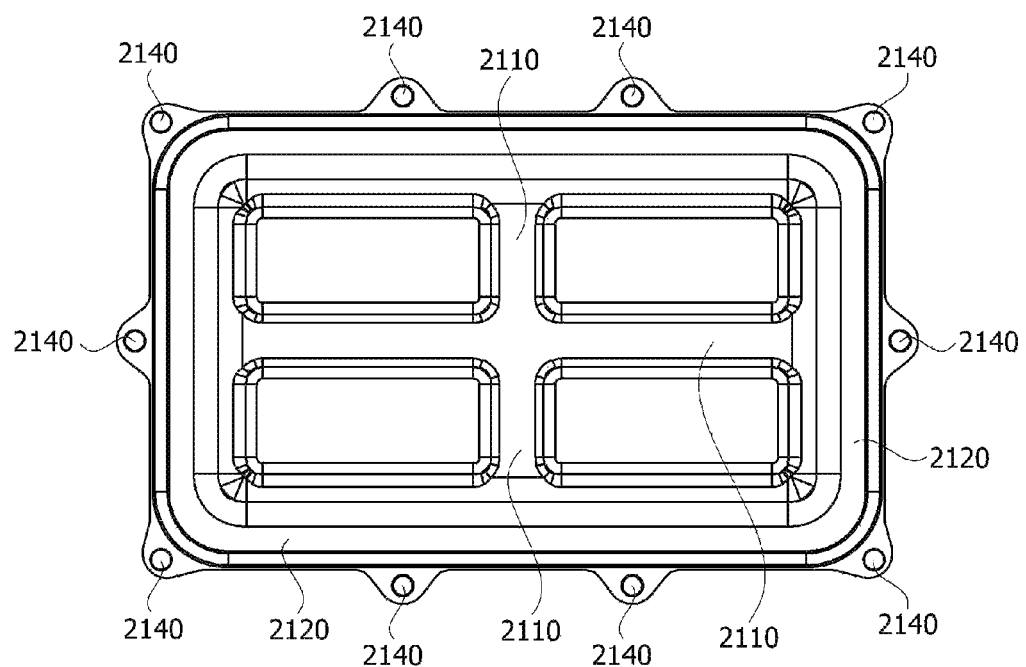
FIG. 10 is a diagram illustrating a shape of a first housing which is a component of FIG. 9.
Figure 11:
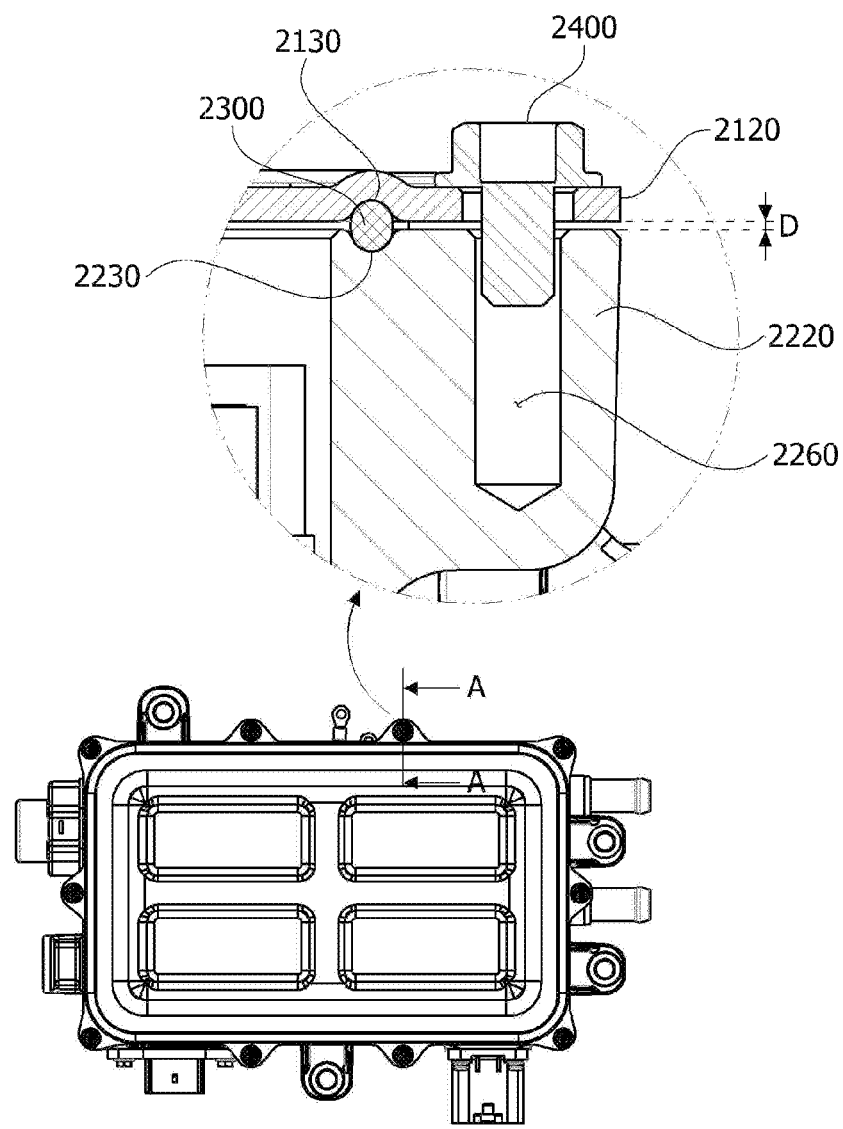
FIG. 11 is a cross-sectional view illustrating a coupling state of FIG. 9.
Figure 12:
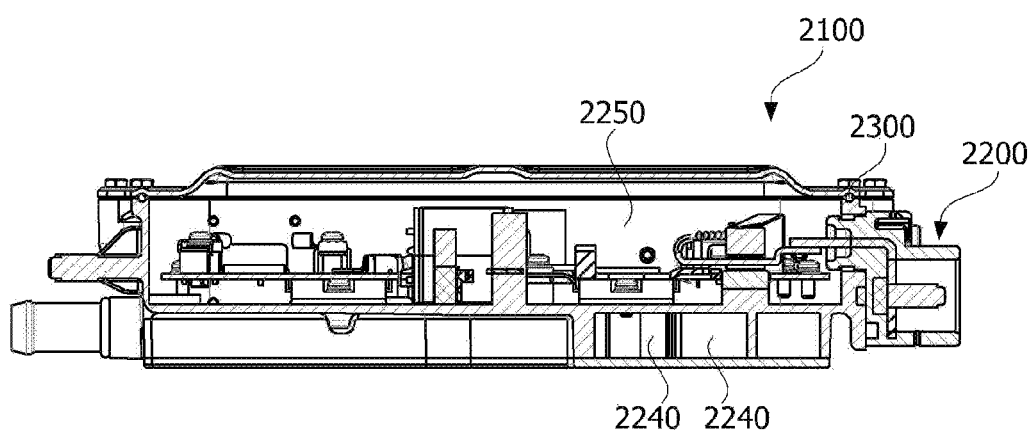
FIG. 12 is a cross-sectional view illustrating an internal structure of FIG. 10.

FIG. 9 is an exploded perspective view of an electronic component housing according to an exemplary embodiment of the present invention, FIG. 10 is a diagram illustrating a shape of a first housing which is a component of the present invention, and FIG. 11 is a cross-sectional view illustrating a coupling state of the present invention. FIG. 12 is a cross-sectional view illustrating an internal structure of the present invention.

Referring to FIGS. 9 to 12, an electronic component housing 1a according to the second embodiment of the present invention may include a first housing 2100, a second housing 2200, a sealing member 2300, and fixing members 2400.

The first housing 2100 may be disposed above the second housing 2200 and coupled to the second housing 2200 to form an electronic component accommodating part 2250 in which an electronic component is disposed. When the first housing 2100 is coupled to the second housing 2200, the first housing 2100 may serve as a cover and include a plurality of through holes 2140 in which the fixing members 2400 are fixed. The through hole 2140 may be disposed on an outer side of a first guide portion 2130.

The electronic component accommodating part 2250 for accommodating an electronic component 2500 may be formed in the second housing 2200. A flow path 2240 through which a fluid can flow to release heat generated from the electronic component may be provided in a lower portion of the second housing 2200.

The flow path 2240 may allow cooling water supplied through a cooling part (not shown) to circulate, thereby releasing heat generated from the electronic component. A shape of the flow path is not limited and may be modified into various shapes.

A coupling groove 2260 to which the fixing member 2400 is coupled may be formed in the second housing 2200. The coupling groove 2260 may be disposed to face the through hole 2140 formed in the first housing 2100. The fixing member 2400 may pass through the through hole 2140 to be fixed to the coupling groove 2260. For example, when a screw is used as the fixing member 2400, a screw thread may be formed on an inner surface forming the coupling groove 2260.

An upper protrusion having a predetermined width may be provided on the first housing 2100 along an outer perimeter thereof. A lower protrusion having a predetermined width may be provided on the second housing 2200 along an outer perimeter thereof.

The upper protrusion may be disposed to face the lower protrusion, the sealing member 2300 may be disposed between the upper protrusion and the lower protrusion, and the first housing 2100 and the second housing 2200 may be fixed through the fixing member 2400.

The sealing member 2300 may be disposed between the first housing 2100 and the second housing 2200. When the first housing 2100 is coupled to the second housing 2200, the sealing member 2300 may maintain a predetermined separation distance D between the first housing 2100 and the second housing 2200. In this case, a responsive member or a non-responsive member may be used as the sealing member 2300, and various materials may be used to form a sealing structure. For example, rubber may be used as the sealing member 2300.

A guide portion 2130 or 2230 for preventing movement of the sealing member 2300 may be formed on at least one of the first housing 2100 and the second housing 2200. The first guide portion 2130 may be provided on the first housing 2100, and a second guide portion 2230 may be provided on the second housing 2200. The first guide portion 2130 may be disposed at a position corresponding to the second guide portion 2230.

The first guide portion 2130 and the second guide portion 2230 may be provided in the form of a protrusion or a groove so as to prevent movement of the sealing member 2300. For example, when the guide portions 2130 and 2230 are provided in the form of a groove, the guide portions 2130 and 2230 may be formed in the groove which is recessed inward at least one of the first housing 2100 and the second housing 2200. The guide portions 2130 and 2230 may each be formed to face the first housing 2100 and the second housing 2200.

In this case, the sealing member 2300 may be formed in an elliptic or circular shape to be disposed between the grooves and may form a sealing structure of the first housing 2100 and the second housing 2200 through pressing.

The sealing member 2300 may be formed to be wider than a width of the groove and may be disposed in the guide portions 2130 and 2230 of the first housing 2100 and the second housing 2200. The sealing member 2300 having a curved surface may be pressed by an end bump, which forms the groove, to increase a sealing force.

FIG. 11 illustrates a configuration in which the grooves are opposite to each other. Alternatively, the configuration may be provided such that the groove accommodates a protrusion, and the groove may be opposite to the protrusion or the protrusions may be opposite to each other.

The first guide portion 2130 and the second guide portion 2230 may be disposed to be spaced inward from outermost peripheries of the first housing 2100 and the second housing 2200. For example, in order to prevent release of the sealing member 2300, the first guide portion 2130 and the second guide portion 2230 may be disposed at a predetermined separation distance inward from outermost surfaces of an upper protrusion and a lower protrusion.

The fixing member 2400 may fix the first housing 2100 and the second housing 2200 and press the sealing member 2300 to form a sealing structure. The fixing member 2400 may be fixed using a bolt and nut structure to fix the first housing 2100 and the second housing 2200 at positions spaced outward from the sealing member 2300.

The first housing 2100 and the second housing 2200 according to the exemplary embodiment of the present invention are coupled to each other by the fixing member 2400 in a state of being spaced a predetermined distance apart from each other. In this case, as compared with a case in which the first housing 2100 is brought into contact with and fixed to the second housing 2200, a pressing force is increased to enhance a sealing force of the electronic component housing 1a. For example, a shortest separation distance D between the first housing 2100 and the second housing 2200 may be fixed in a range of 0.5 to 1.5 mm by the fixing member 2400.

At least one support 2110 may be provided on the first housing 2100. When the first housing 2100 is pressed by the fixing member 2400, a moment acts on the first housing 2100 based on the sealing member 2300, and a central portion of the first housing 2100 is inflated. In this case, a problem may occur in the sealing structure of the housing. In order to prevent such a problem, the support 2110 may be disposed on the first housing 2100 to resist the moment generated by the fixing member 2400.

For example, a plurality of supports 2110 may be provided on the first housing 2100 and disposed to intersect with each other. As shown in FIG. 2, the first housing 2100 and the second housing 2200 may be provided in a structure of being fixed through a plurality of fixing members 2400 along an outer surface of the housing. In this case, the moment acts toward the central portion of the first housing 2100. The supports 2110 may be disposed to cross with each other so as to pass the center of the first housing 2100, thereby resisting the moment acting on the first housing 2100 to prevent deformation of the housing.

Each of the supports 2110 may have a groove structure formed by a recess of the first housing 2100 or a protrusion structure protruding outward. A separate material is not added to the support 2110 formed in a groove structure such that a material cost may be reduced as well as resistance of the first housing 2100 may be enhanced. In the exemplary embodiment of the present invention, the support 2110 is exemplified as being disposed in the form of a groove, but the present invention is not limited thereto, and the support 2110 may be provided as a rib structure.

The support 2110 may be disposed in a bilaterally symmetrical structure. The bilaterally symmetrical structure may stably support the moment acting by the fixing member 2400.

Further, a plurality of supports 2110 may be provided. Each of the plurality of supports 2110 may be formed in a structure in which a recessed region formed upward from the first housing 2100 and a recessed region formed downward from the first housing 2100 are repeated.

An end bump structure formed in the housing through the recessed region may increase resistance to the moment. Therefore, overall resistance may be increased through the structure in which the recessed regions are repeated vertically.

For example, the first housing 2100 may be formed using aluminum pressing. When aluminum pressing is used, the first housing 2100, the support 2110, and the through hole 2140 may be manufactured at a time.

Figure 13:
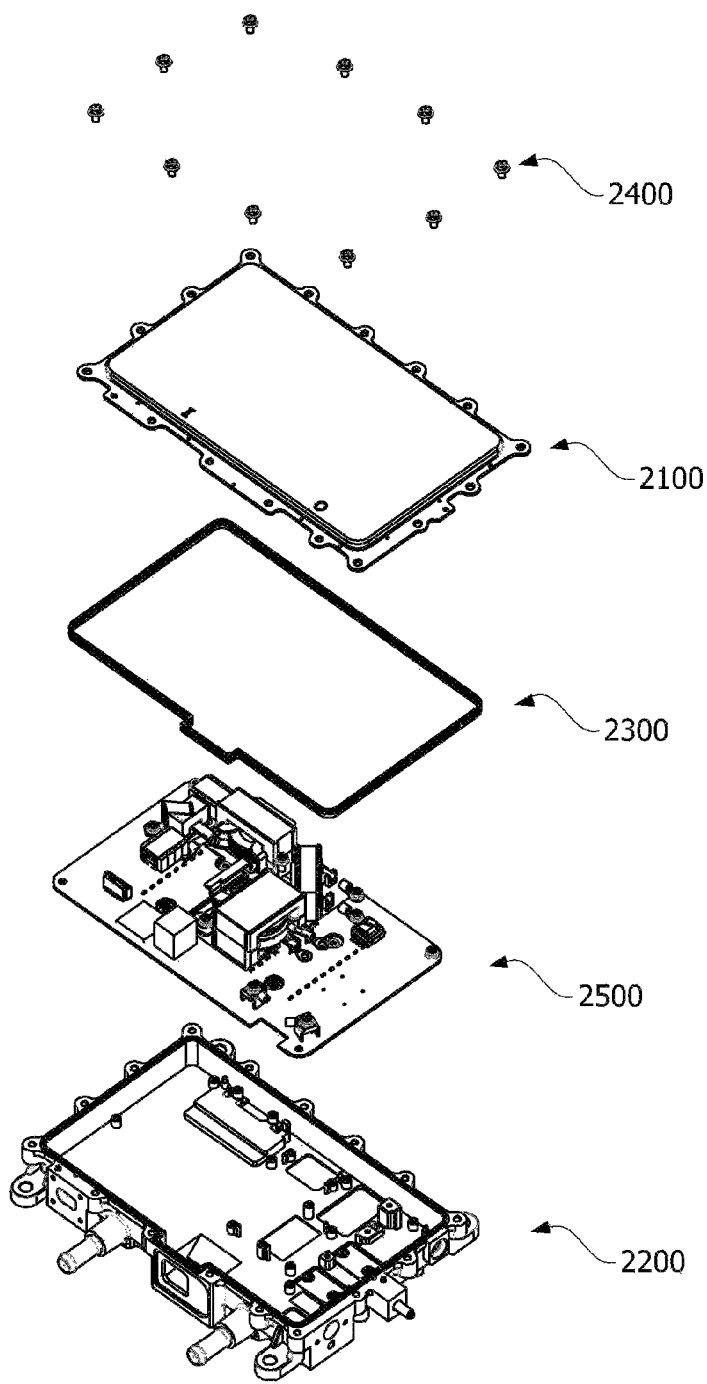
FIG. 13 is a diagram illustrating a structure of a DC-DC converter according to still another exemplary embodiment of the present invention.

FIG. 13 is a diagram illustrating a structure of a DC-DC converter according to still another exemplary embodiment of the present invention. In FIG. 13, the same reference numerals as in FIGS. 9 to 12 denote the same members, and thus detailed descriptions thereof will be omitted.

Referring to the drawing, a DC-DC converter 2a according to still another embodiment of the present invention may include the first housing 2100, the second housing 2200 coupled to the first housing 2100 and including the electronic component accommodating part 2250 in which the electronic component 2500 is disposed, the electronic component 2500 disposed in the electronic component accommodating part 2250, the sealing member 2300 disposed between the first housing 2100 and the second housing 2200, and the fixing member 2400 for fixing the first housing 2100 to the second housing 2200. The first housing 2100 and the second housing 2200 may be separated by the sealing member 2300, and the first housing 2100 may include the first guide portion 2130 for preventing movement of the sealing member 2300.

The DC-DC converter 2a is a device for converting a DC voltage. The DC-DC converter 2a may obtain a DC voltage by converting a DC voltage into an AC voltage, transforming the AC voltage, and then rectifying the transformed AC voltage again. The electronic component which is a component of the present invention may include various components for implementing the electronic component.

For example, the electronic component 2500 may include various components such as a switch, a transformer, a rectifier diode, and the like.

DESCRIPTION OF REFERENCE NUMERALS 1 and 1a: electronic component housing, 2 and 2a: direct current (DC)-DC converter, 1100: first housing, 1110: connection hole, 1120: through hole, 1200: second housing, 1210: accommodating groove, 1212: inclined portion, 1220: coupling groove, 1230: flow path, 1240: electronic component accommodating part, 1300: sealing member, 1310: upper sealing member, 1320: lower sealing member, 1330: connector, 1400: fixing member, 1500: electronic component, 2100: first housing, 2110: support, 2130: first guide portion, 2140: through hole, 2200: second housing, 2230: second guide portion, 2240: flow path, 2250: electronic component accommodating part, 2260: coupling groove, 2300: sealing member, 2400: fixing member, and 2500: electronic component

The invention claimed is:

1. An electronic component housing comprising:
a first housing;
a second housing;
a sealing member disposed between the first housing and the second housing; and
a fixing member fixing the first housing to the second housing,
wherein the sealing member passes through the first housing to be insert-injected thereto,
wherein the sealing member includes:
an upper sealing member disposed above the first housing;
a lower sealing member disposed below the first housing; and
a plurality of connectors passing through the upper sealing member to connect the upper sealing member to the lower sealing member, and
wherein the first housing includes a plurality of connection holes spaced apart along a periphery of the first housing and extending through the first housing in a first direction toward the second housing,
wherein each connector is disposed in a respective one of the plurality of connection holes, and
wherein the upper sealing member is in contact with an upper surface of the first housing, the lower sealing member is in contact with a lower surface of the first housing, and each connector passes through the respective connection hole of the first housing to connect the upper sealing member to the lower sealing member.

2. The electronic component housing of claim 1, wherein the second housing includes an accommodating groove in which the lower sealing member is disposed, and
wherein the accommodating groove extends in the first direction.

3. The electronic component housing of claim 2, wherein a length from each connector to a lower surface of the lower sealing member is longer than a depth of the accommodating groove.

4. The electronic component housing of claim 3, wherein the first housing includes a through hole through which the fixing member passes.

5. The electronic component housing of claim 4, wherein the second housing includes a coupling groove to which the fixing member is coupled.

6. The electronic component housing of claim 5, wherein:
the through hole is among a plurality of through holes; and
each connector is disposed between respective through holes among the plurality of through holes.

7. The electronic component housing of claim 2, wherein a width of the accommodating groove is larger than that of the lower sealing member.

8. The electronic component housing of claim 1, wherein an entirety of the upper sealing member is spaced apart from the second housing.

9. The electronic component housing of claim 1, wherein the upper sealing member is spaced apart from the lower sealing member in the first direction.

10. The electronic component housing of claim 1, wherein the first housing is a single unitary member.

11. The electronic component housing of claim 1, wherein the second housing overlaps an entirety of the first housing.

12. The electronic component housing of claim 2, wherein the accommodation groove is surrounded by a planar upper surface of the second housing.

13. A direct current (DC)-DC converter comprising:
a first housing;
a second housing coupled to the first housing and including an electronic component accommodating part configured to accommodate an electronic component;
the electronic component disposed in the electronic component accommodating part;
a sealing member disposed between the first housing and the second housing; and
a fixing member fixing the first housing to the second housing,
wherein the sealing member is insert-injected to the first housing and includes an upper sealing member, a lower sealing member, and a plurality of connectors passing through the upper sealing member to connect the upper sealing member to the lower sealing member,
wherein the first housing includes a plurality of connection holes spaced apart along a periphery of the first housing and extending through the first housing in a first direction toward the second housing,
wherein each connector is disposed in a respective one of the plurality of connection holes, and
wherein the upper sealing member is in contact with an upper surface of the first housing, the lower sealing member is in contact with a lower surface of the first housing, and each connector passes through the respective connection hole of the first housing to connect the upper sealing member to the lower sealing member.

14. The DC-DC converter of claim 13, wherein an entirety of the upper sealing member is spaced apart from the second housing.

15. The DC-DC converter of claim 13, wherein the upper sealing member is spaced apart from the lower sealing member in the first direction.

16. The DC-DC converter of claim 13, wherein the first housing is a single unitary member.

17. The DC-DC converter of claim 13, wherein the second housing overlaps an entirety of the first housing.

18. The DC-DC converter of claim 13, wherein the second housing includes an accommodating groove in which the lower sealing member is disposed, and wherein the accommodating groove extends in the first direction.

19. The DC-DC converter of claim 18, wherein the accommodation groove is surrounded by a planar upper surface of the second housing.

* * * * *